(12) United States Patent
Ishizaka et al.

(10) Patent No.: US 10,927,453 B2
(45) Date of Patent: Feb. 23, 2021

(54) TIN-BASED FILM AND TIN-BASED FILM FORMING METHOD

(71) Applicant: TOKYO ELECTRON LIMITED, Tokyo (JP)

(72) Inventors: Tadahiro Ishizaka, Yamanashi (JP); Masaki Koizumi, Yamanashi (JP); Masaki Sano, Yamanashi (JP); Seokhyoung Hong, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 356 days.

(21) Appl. No.: 15/812,222

(22) Filed: Nov. 14, 2017

(65) Prior Publication Data

US 2018/0135169 A1 May 17, 2018

(30) Foreign Application Priority Data

Nov. 14, 2016 (JP) .............................. JP2016-221346

(51) Int. Cl.
| | | |
|---|---|---|
| *C23C 16/455* | (2006.01) | |
| *C23C 16/34* | (2006.01) | |
| *H01L 21/3205* | (2006.01) | |
| *H01L 21/285* | (2006.01) | |
| *C23C 16/52* | (2006.01) | |
| *H01L 21/28* | (2006.01) | |
| *H01L 21/768* | (2006.01) | |
| *H01L 23/532* | (2006.01) | |
| *H01L 27/105* | (2006.01) | |
| *H01L 29/49* | (2006.01) | |

(52) U.S. Cl.
CPC ........ *C23C 16/34* (2013.01); *C23C 16/45527* (2013.01); *C23C 16/52* (2013.01); *H01L 21/28088* (2013.01); *H01L 21/28562* (2013.01); *H01L 21/32051* (2013.01); *H01L 21/76846* (2013.01); *H01L 23/53266* (2013.01); *H01L 21/28556* (2013.01); *H01L 21/28568* (2013.01); *H01L 27/105* (2013.01); *H01L 29/4966* (2013.01)

(58) Field of Classification Search
CPC .............. C23C 16/45525; C23C 16/34; C23C 16/45527; H01L 23/53266
USPC .................................. 428/698, 699, 701, 702
See application file for complete search history.

(56) References Cited

U.S. PATENT DOCUMENTS

| | | | |
|---|---|---|---|
| 5,449,954 A * | 9/1995 | Ito ..................... | H01L 21/76856 257/751 |
| 6,417,537 B1 | 7/2002 | Yang et al. | |
| 2004/0106261 A1* | 6/2004 | Huotari ............... | H01L 29/4966 438/287 |
| 2005/0032364 A1 | 2/2005 | Okubo et al. | |

(Continued)

FOREIGN PATENT DOCUMENTS

| | | |
|---|---|---|
| CN | 101238582 A | 8/2008 |
| CN | 102373431 A | 3/2012 |
| CN | 102412186 A | 4/2012 |

(Continued)

*Primary Examiner* — Elizabeth A Burkhart
(74) *Attorney, Agent, or Firm* — Fenwick & West LLP

(57) ABSTRACT

A TiN-based film includes TiON films having an oxygen content of 50% or above and TiN films which are laminated alternately on a substrate. In a TiN-based film forming method, a TiON film having an oxygen content of 50 at % or above and a TiN film are alternately formed on a substrate.

18 Claims, 10 Drawing Sheets

(56) References Cited

U.S. PATENT DOCUMENTS

2012/0214300 A1\*  8/2012  Kaga .................... C23C 16/308
                                                          438/597
2014/0227843 A1    8/2014  Tsukamoto et al.

FOREIGN PATENT DOCUMENTS

| JP | H05-121356 A     | 5/1993 |
| JP | 1996-130302 A    | 5/1996 |
| JP | 2003-193233 A    | 7/2003 |
| JP | 2014-154790 A    | 8/2014 |
| KR | 10-2000-0007465 A | 2/2000 |
| KR | 10-2013-0030213 A | 5/2014 |

\* cited by examiner

TIN-BASED FILM AND TIN-BASED FILM FORMING METHOD

CROSS-REFERENCE TO RELATED APPLICATIONS

This application claims priority to Japanese Patent Application No. 2016-221346 filed on Nov. 14, 2016, the entire contents of which are incorporated herein by reference.

FIELD OF THE INVENTION

The disclosure relates to a TiN-based film and a TiN-based film forming method.

BACKGROUND OF THE INVENTION

In a memory device, a tungsten wiring is used in a word line or a bit line which connects cells. When the tungsten wiring is formed, $WF_6$ gas is used as a raw material gas. In the case of using the $WF_6$ gas, an F-based gas having high reactivity is generated as a by-product during film formation. Therefore, before the formation of the tungsten film, a TiN film is formed as a barrier film for the tungsten film (see, e.g., Japanese Patent Application Publication No. 2003-193233).

Recently, miniaturization of semiconductor devices is advancing to improve performance of the devices and semiconductor devices having a 3D structure such as VNAND are being introduced. Therefore, a word line or a bit line needs to be thinner. In order to reduce a resistance of a wiring by maximizing a cross section of tungsten in the wiring, the barrier film needs to be thinner. However, when the barrier film that is a TiN film becomes thinner, F-based gas penetrates through a grain boundary, which may result in deterioration of the barrier property. Accordingly, there is required a barrier film capable of maintaining a high barrier property in spite of the reduction in the film thickness.

The TiN film is also used as a gate metal of a logic device (see, e.g., Japanese Patent Application Publication No. 2014-154790). Due to the miniaturization of semiconductor devices, the gate metal also becomes thinner and, thus, variation in a crystal grain size of the TiN film causes non-uniformity of a threshold voltage.

Since the TiN film used as the gate metal or as the barrier film of the tungsten wiring becomes thinner due to the miniaturization of devices, it is difficult to obtain desired characteristics.

SUMMARY OF THE INVENTION

In view of the above, the disclosure provides a TiN-based film serving as a barrier film capable of maintaining a high barrier property in spite of reduction in a film thickness or serving as a gate metal capable of suppressing non-uniformity of a threshold voltage, and a forming method thereof.

In accordance with a first aspect, there is provided a TiN-based film in which a TiON film having an oxygen content of 50% or above and a TiN film are laminated alternately on a substrate.

In accordance with a second aspect, there is provided a TiN-based film forming method including: alternately forming a TiON film having an oxygen content of 50 at % or above and a TiN film on a substrate.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings.

(Structure of TiN-Based Film)

First, a structure of a TiN-based film according to an embodiment will be described.

Figure 1:
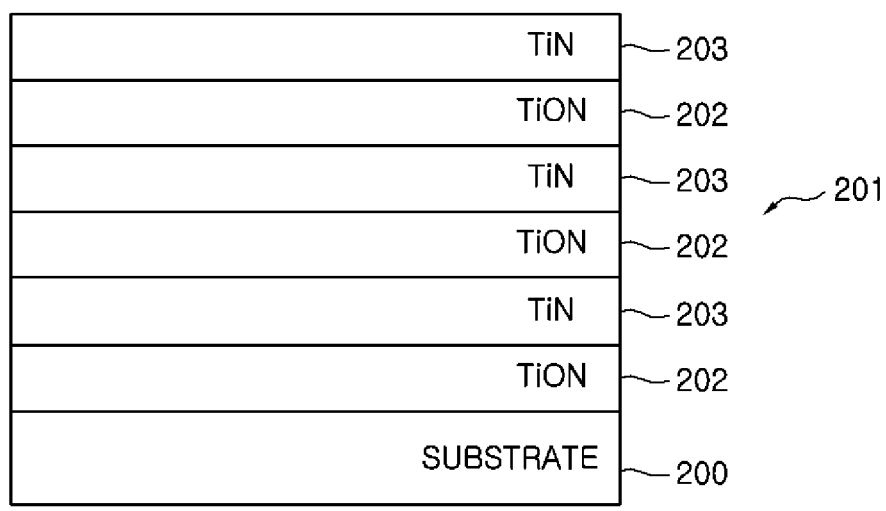
FIG. 1 is a cross sectional view of a TiN-based film according to an embodiment.

FIG. 1 is a cross sectional view showing the TiN-based film according to the embodiment. As shown in FIG. 1, a TiN-based film 201 of the present embodiment has a structure in which a TiON film 202 having an oxygen (O) content of 50 at % or above and a TiN film 203 are laminated alternately multiple times on a substrate 200 having a predetermined structure. FIG. 1 shows an example in which the TiON film and the TiN film are laminated alternately three times.

As for the substrate 200, there is used a substrate having a structure optimal for a device to be formed. For example, when a TiN-based film 201 is used as a barrier film of a tungsten wiring, a substrate that is made of a semiconductor such as silicon and has a $SiO_2$ film or a SiN film formed thereon is used as the substrate 200. For example, when the TiN-based film 201 is used as a gate metal of a logic device, a substrate that is made of a semiconductor such as silicon and has a high dielectric film (high-k film) such as an $HfO_2$ film formed thereon is used as the substrate 200.

The TiON film 202 and the TiN film 203, which form the TiN-based film 201, are preferably formed by a film forming method based on an Atomic Layer Deposition (ALD). The film forming method will be described in detail later.

In the case of alternately laminating the TiON film 202 having the oxygen content of 50 at % or above and the TiN film 203, a film having a small crystal size can be formed due to a difference in crystal structures and a difference in lattice constants.

In other words, as can be seen from the following Table 1, TiON having an O content of 50 at % or less has a cubic crystal structure (crystal system) as in the case of TiN and the lengths of the lattice constants a, b and c are the same. On the other hand, TiON having an O content of 50 at % or above has an orthorhombic crystal structure and the lengths of the lattice constants a, b and c are different. The lattice constants of TiON are considerably different from those of TiN. By positioning layers having different crystal structure and different lattice constants close to each other, crystallization is suppressed and amorphization occurs. Accordingly, a total crystal size of the TiN-based film 201 can be reduced.

TABLE 1

| | Crystal system | Oxygen content (at %) | Lattice constant | | |
|---|---|---|---|---|---|
| | | | a | b | c |
| $Ti_{2.85}O_4N$ | orthorhombic | 51.0 | 3.804 | 9.6486 | 9.8688 |
| $TiN_{0.6}O_{0.4}$ | cubic | 20.0 | 6.835 | 6.835 | 6.835 |
| TiN | cubic | 0.0 | 4.2417 | 4.2417 | 4.2417 |

In the case of using the TiN-based film having a small crystal size as a barrier film, the number of crystal grain boundaries is greater than that in a conventional TiN film and, thus, a high barrier property can be obtained in spite of the reduction in the film thickness. In the case of using the TiN-based film having a small crystal size as a gate metal, distribution of a crystal grain size becomes more uniform and, thus, non-uniformity of a threshold voltage can be suppressed. It is preferable to minimize the thickness of the TiN-based film. A total film thickness of the TiN film is preferably 3 nm or less.

The TiON film 202 and the TiN film 203 preferably have a thickness of 2 nm or less and more preferably have a thickness of 0.2 nm to 1 nm. The number of lamination thereof is not particularly limited and optimally set depending on a total film thickness of the TiN-based film 201 to be formed. Preferably, the TiON film 202 and the TiN film 203 are laminated three times or more. It is preferable to form the TiON film 202 and the TiN film 203 in that order on the substrate 200. This is because when the TiN film 203 is formed first, the crystal structure of the TiN film is easily dragged when the TiON film 202 is formed.

(TiN-Based Film Forming Method)

Next, a TiN-based film forming method will be described.

The TiON film 202 and the TiN film 203 are preferably formed by a film forming method based on ALD. It is preferable to form the TiN-based film 201 by alternately repeating the formation of the TiON film 202 and the formation of the TiN film 203. At this time, it is preferable to consecutively perform the formation of the TiON film 202 and the formation of the TiN film 203 in the chamber of the same film forming apparatus.

(TiON Film Forming Process)

It is preferable to form the TiON film 202 by repeating multiple times (Y cycles) a cycle of alternately supplying a Ti-containing gas and a nitriding gas with a process of purging an inside of the chamber interposed therebetween multiple times (X times), supplying the oxidizing agent, and purging the chamber in a state where the substrate 200 is accommodated in the chamber.

In the case of employing such a film forming method, the oxygen content in the film can be adjusted by controlling the value of X, and a TiON film having an O content of 50 at % or above can be formed. The O content can also be adjusted by controlling either one or both of the supply amount of the oxidizing agent and the supply period of the oxidizing agent, in addition to the control of the value of X.

This will be described in detail hereinafter.

As for the Ti-containing gas used for the film formation, titanium tetrachloride ($TiCl_4$) gas is preferably used. It is also possible to use tetra(isopropoxy)titanium (TTIP), titanium(IV)bromide ($TiBr_4$), titanium(IV)Iodide ($TiI_4$), tetrakisethylmethylaminotitanium (TDEAT), tetrakisdimethylaminotitanium (TDMAT), tetrakisdiethylaminotitanium (TDEAT) or the like, instead of the $TiCl_4$ gas. As for the nitriding gas, $NH_3$ gas is preferably used. It is also possible to use monomethylhydrazine (MMH) instead of the $NH_3$ gas. As for the oxidizing agent, an oxygen-containing gas such as $O_2$ gas, $O_3$ gas, $H_2O$, $NO_2$ or the like may be used. A plasma of the oxygen-containing gas may also be used as the oxidizing agent. As for the purge gas, $N_2$ gas or a rare gas such as Ar gas or the like may be used.

Figure 2:
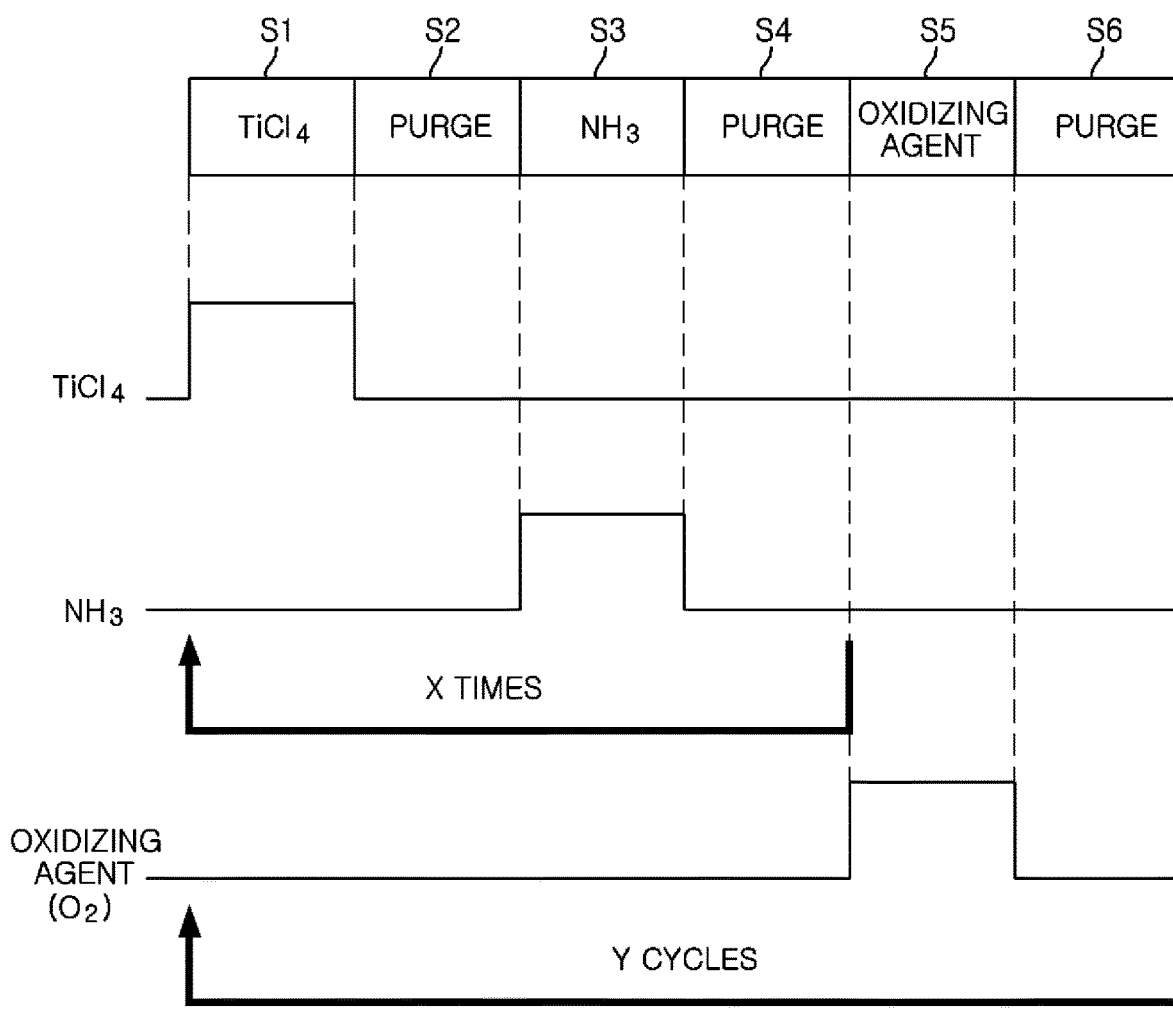
FIG. 2 is a timing chart showing an exemplary sequence of a method for forming a TiON film included in the TiN-based film.
Figure 3:
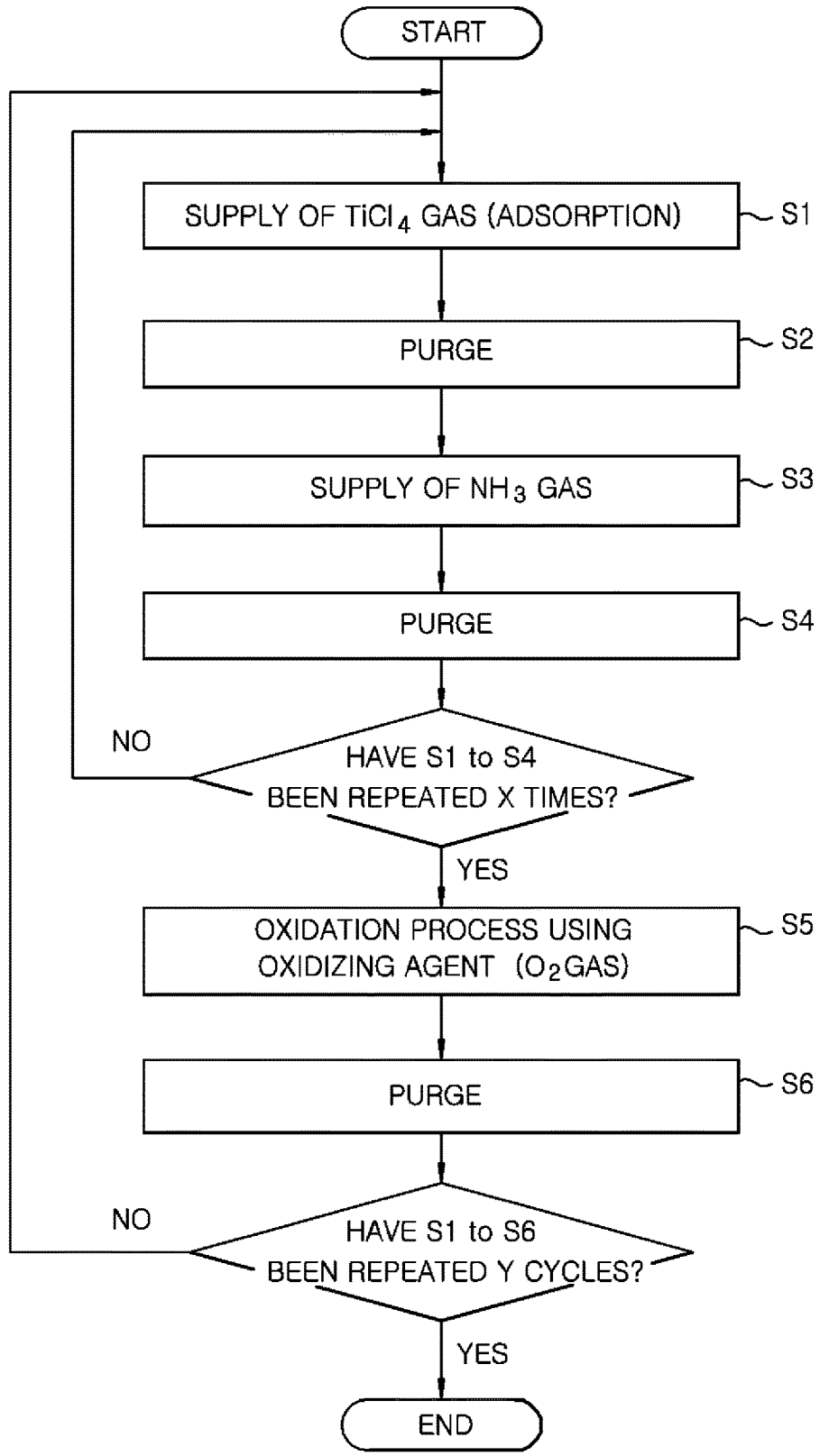
FIG. 3 is a flowchart showing the exemplary sequence of the method for forming a TiON film shown in FIG. 2.

An example of a specific sequence at this time will be described with reference to the timing chart of FIG. 2 and the flowchart of FIG. 3.

First, $TiCl_4$ gas as a Ti-containing gas is supplied into the chamber to be adsorbed onto an underlying layer (step S1). Next, the supply of $TiCl_4$ gas is stopped and the chamber is purged by $N_2$ gas as a purge gas (step S2). Then, a nitriding gas, e.g., $NH_3$ gas, is supplied into the chamber and made to react with the adsorbed $TiCl_4$, thereby forming TiN (step S3). Thereafter, the supply of $NH_3$ gas is stopped and the chamber is purged by $N_2$ gas (step S4). The steps S1 to S4 are repeated X times. Then, an oxidation process is performed by supplying $O_2$ gas as an oxidizing agent into the chamber (step S5). Next, the chamber is purged (step S6). By repeating Y times a cycle of repeating the steps S1 to S4 X times, and performing the steps S5 and S6, a TiON film having a desired thickness is obtained.

Figure 4:
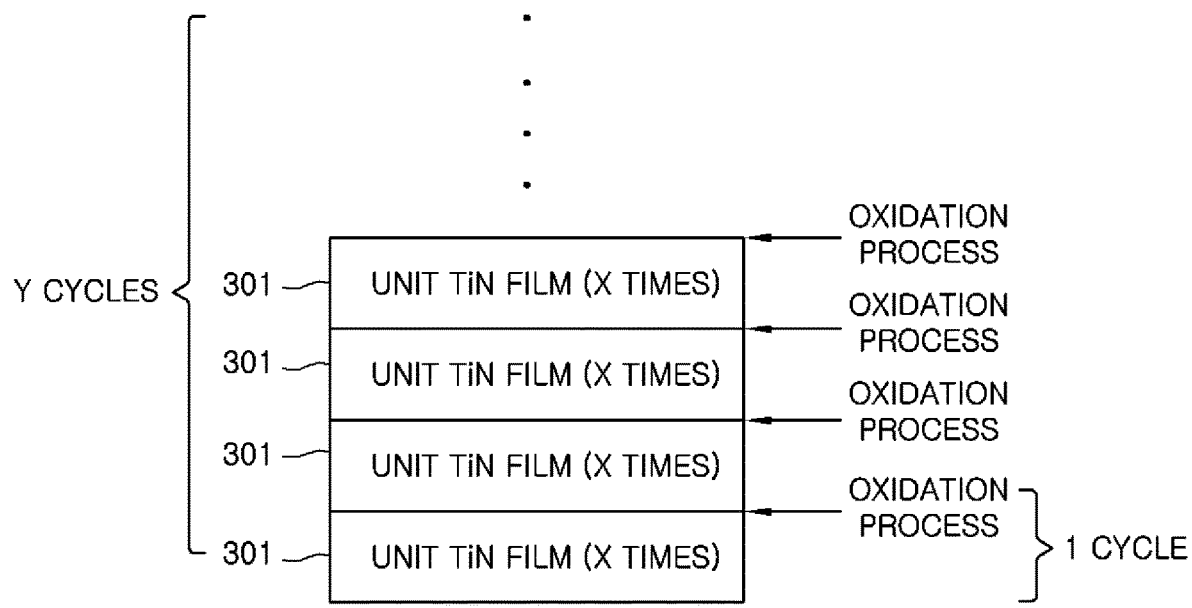
FIG. 4 schematically shows a film formation state in the case of forming a TiON film based on the sequence shown in FIGS. 2 and 3.

The state of the formed film at this time is shown in FIG. 4. As can be seen from FIG. 4, a unit TiN film 301 having a predetermined thickness is formed by repeating the steps S1 to S4 X times and, then, the unit TiN film 301 is oxidized by performing an oxidation process in the step S5 and a purge process in the step S6. By repeating Y times such a cycle, a TiON film having a predetermined film thickness is formed. At this time, the amount of oxygen in the TiON film can be controlled by X, i.e., the number of repetition of the steps S1 to S4. In other words, when X is decreased, the frequency of oxidation is increased and, thus, the oxygen content in the film is increased. On the contrary, when X is increased, the oxygen content in the film is decreased. For example, in the case of supplying $O_2$ gas at a flow rate of 1400 sccm for 15 seconds, the O content in the film can become about 62 at % by setting X to 1; the O content in the film can become about 55 at % by setting X to 6; and the O content in the film can become about 50 at % by setting X to 9. As described above, the O content in the film can be controlled by either one or both of the supply amount of the oxidizing agent and the supply period of the oxidizing agent, in addition to the control of the value of X.

Further, the film thickness can be controlled by the value of Y, i.e., the number of repetition of the cycles of repeating the steps S1 to S4 a predetermined number of times and then performing the steps S5 and S6.

Figure 5:
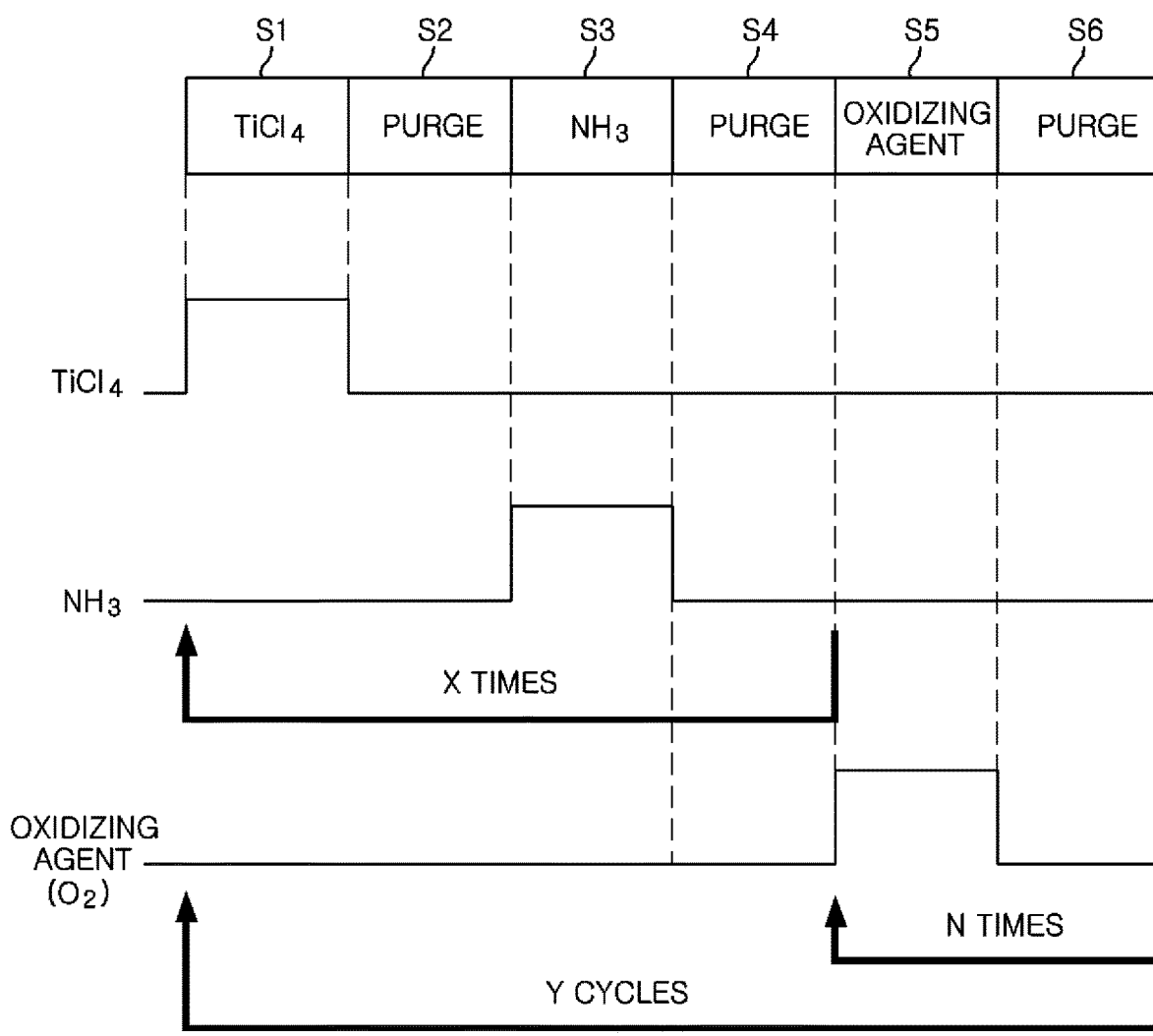
FIG. 5 is a timing chart showing another exemplary sequence of the method for forming a TiON film included in the TiN-based film.
Figure 6:
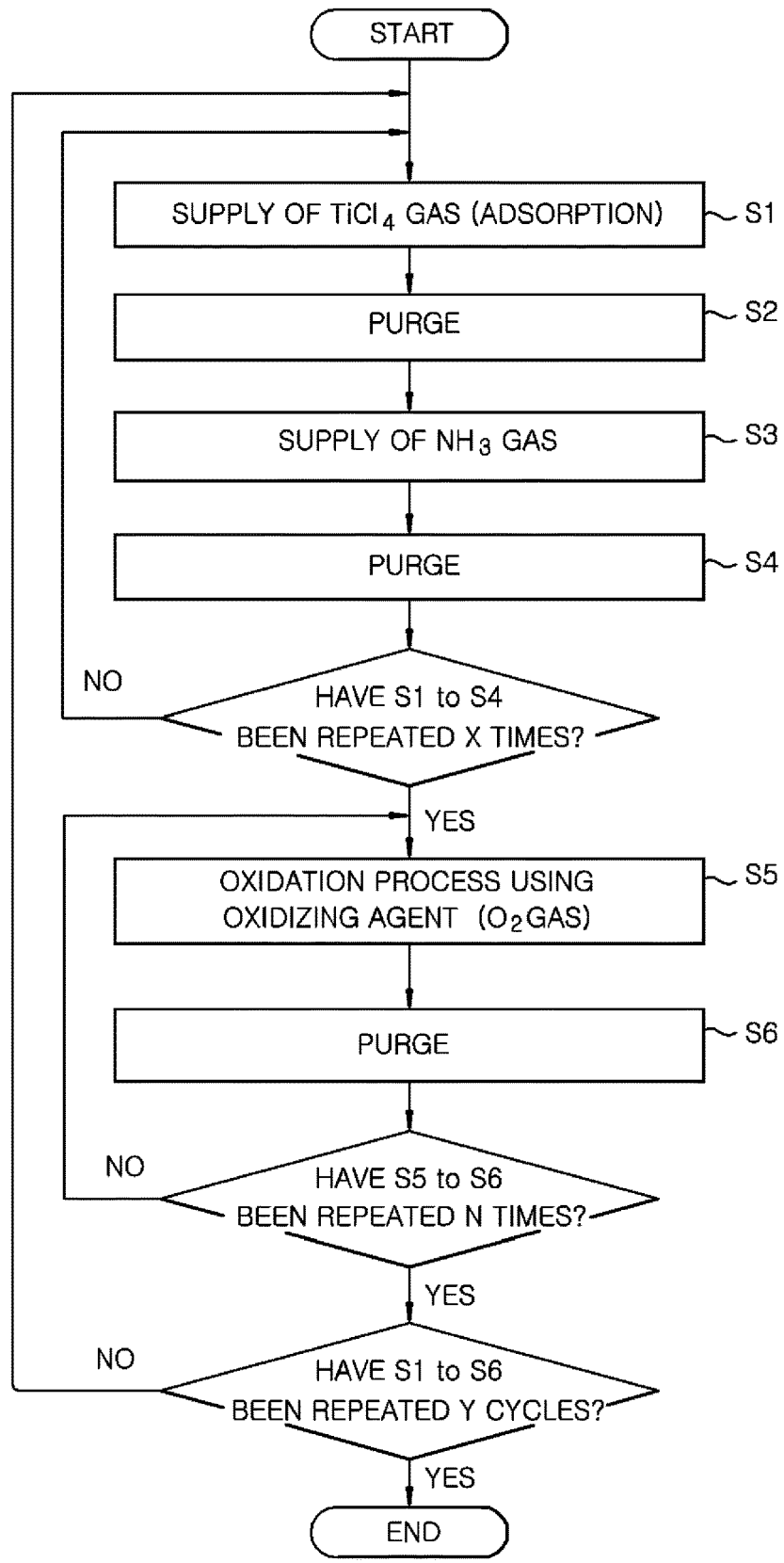
FIG. 6 is a flowchart showing the exemplary sequence of the method for forming a TiON film shown in FIG. 5.

As shown in FIGS. 5 and 6, the oxidation process in the step S5 and the purge process in the step S6 may be repeated multiple times (N times). Accordingly, the amount of the supplied oxidizing agent is increased and the oxidation efficiency can be improved.

In forming the TiON film, X may be changed during the film formation to control the degree of oxidation of TiN. Or, another step may be added to the basic steps, i.e., the steps S1 to S6, in order to promote oxidation or nitriding.

In the case of using $TiCl_4$ gas as a Ti source gas, $NH_3$ gas as a nitriding gas, $N_2$ gas as a carrier/purge gas, and $O_2$ gas as an oxidizing agent, preferable ranges of the film forming conditions are as follows.

Processing temperature (susceptor temperature): 300 to 500° C.
Pressure in chamber: 13.33 to 1333 Pa (0.1 to 10 Torr)
$TiCl_4$ gas flow rate: 10 to 300 mL/min (sccm)
$NH_3$ gas flow rate: 1000 to 10000 mL/min (sccm)
$N_2$ gas flow rate: 1000 to 30000 mL/min (sccm)
Duration of step 1 per once: 0.01 to 3 sec
Duration of step 3 per once: 0.01 to 3 sec
Duration of steps 2 and 4 per once: 0.01 to 3 sec
$O_2$ gas flow rate: 10 to 3000 mL/min (sccm)
Total $O_2$ gas supply period: 0.1 to 60 sec (0.05 to 30 sec and more preferably 0.05 to 5 sec per once when $O_2$ gas is supplied multiple times)

(TiN Film Forming Step)

The TiN film 203 is preferably formed by a method for alternately supplying a Ti-containing gas and a nitriding gas multiple times with a process of purging the chamber interposed therebetween in a state where the substrate 200 is accommodated in the chamber. The Ti-containing gas, the nitriding gas and the purge gas used at this time are the same as those used in forming the TiON film.

An example of a specific sequence at this time will be described with reference to the timing chart of FIG. 7.

Figure 7:
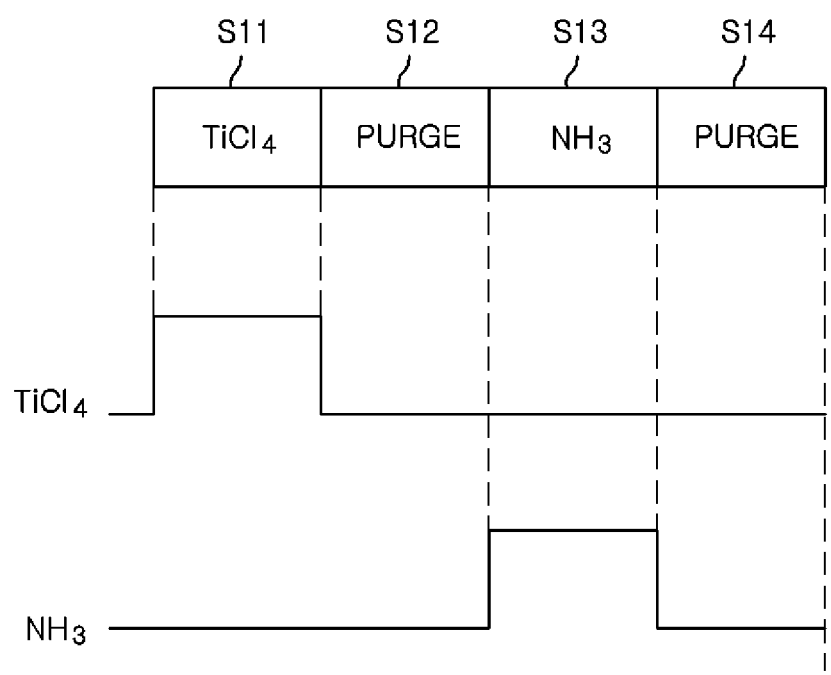
FIG. 7 is a timing chart showing an exemplary sequence of a method for forming a TiN film included in the TiN-based film.

As shown in FIG. 7, the TiN film can be formed by repeating a process of adsorbing $TiCl_4$ gas to an underlying layer (step S11), a process of stopping the supply of $TiCl_4$ gas and purging the chamber by $N_2$ gas as the purge gas (step S12), a process of supplying the nitriding gas, e.g., $NH_3$ gas, into the chamber and forming TiN by reaction between $NH_3$ gas and the adsorbed $TiCl_4$ (step S13), and a process of stopping the supply of $NH_3$ gas and purging the chamber by $N_2$ gas (step S14) multiple times. At this time, the film thickness can be controlled by controlling the repetition number of the steps 11 to 14.

The steps S11 to S14 may be executed under the same conditions of the steps S1 to S4 in forming the TiON film.

In accordance with the present disclosure, the TiON film having an oxygen content of 50 at % or above and the TiN film are alternately laminated on the substrate. Therefore, the TiN-based film having a small crystal size can be formed due to the difference in the crystal structures and the difference in the lattice constants. Accordingly, the TiN film used as the barrier film has a larger number of crystal grains compared to that in the conventional TiN film. As a consequence, the high barrier property can be obtained in spite of the reduction in the film thickness. Since the crystal size is reduced, the TiN film used as the gate metal has more uniform distribution of the crystal grain diameter. As a result, the uniformity of the threshold voltage can be suppressed.

Japanese Patent Application Publication No. H5-121356 discloses a method for increasing a barrier property by forming a TiNx layer, transferring a substrate to an oxidizing atmosphere, performing an oxidation process, and forming a TiOxNy layer on a surface of the TiNx layer. However, Japanese Patent Application Publication No. H5-121356 does not disclose a method for forming a TiN-based film having a small crystal size by alternately laminating a TiON film having an oxygen content of 50 at % or above and a TiN film, and it does not suggest the present disclosure.

(Film Forming Apparatus)

Figure 8:
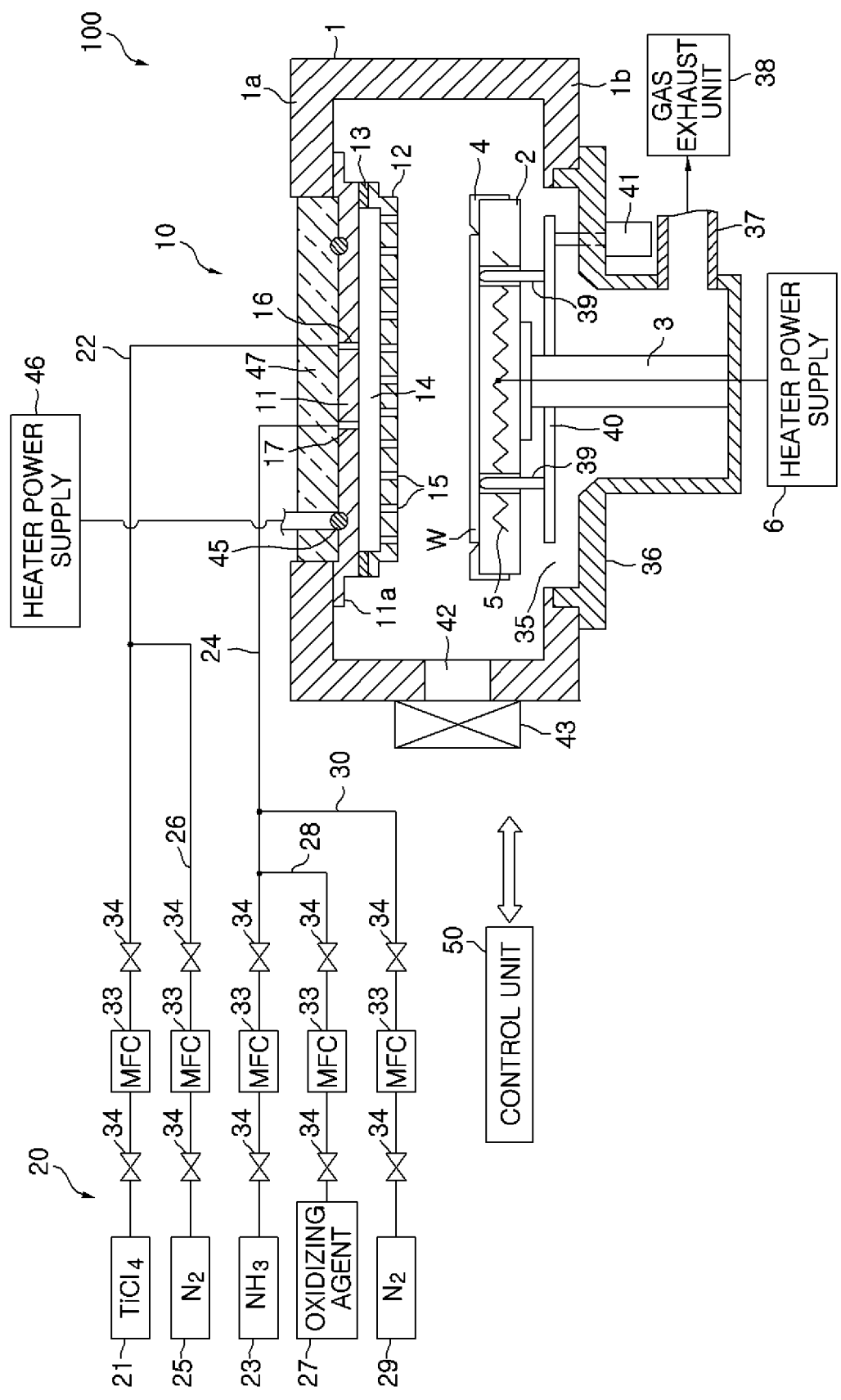
FIG. 8 is a cross sectional view showing an example of a film forming apparatus capable of forming a TiON film and a TiN film constituting a TiN-based film according to the embodiment.

Next, an example of the film forming apparatus capable of forming a TiON film and a TiN film of a TiN-based film will be described. FIG. 8 is a cross sectional view showing an example of the film forming apparatus.

The film forming apparatus 100 forms a TiON film and a TiN film alternately on a semiconductor wafer (hereinafter, simply referred to as "wafer") as a target substrate which has the same structure as that of the substrate 200. The film forming apparatus 100 includes a substantially cylindrical chamber 1. In the chamber 1, a susceptor 2 made of AlN is supported by a cylindrical supporting member 3 provided at the center of the bottom portion of the chamber 1. The susceptor 2 serves as a stage for horizontally supporting the wafer W. A guide ring 4 for guiding the wafer W is provided at an outer peripheral portion of the susceptor 2. A heater 5 made of a high-melting point metal, e.g., molybdenum or the like, is buried in the susceptor 2. The heater 5 heats the wafer W as a target substrate to predetermined temperature by power supplied from a heater power supply 6.

A shower head 10 is provided at ceiling wall 1a of the chamber 1. The shower head 10 includes a base member 11 and a shower plate 12. An outer peripheral portion of the shower plate 12 is fixed to the base member 11 by screws (not shown) through an annular intermediate member 13 for preventing adhesion. The shower plate 12 is formed in a flange shape and has a recess therein. A gas diffusion space 14 is formed between the base member 11 and the shower plate 12. A flange portion 11a is formed at an outer periphery of the base member 11 and attached to the ceiling wall 1a of the chamber 1. A plurality of gas injection holes 15 is formed in the shower plate 12. Two gas inlet holes 16 and 17 are formed in the base member 11.

The gas supply unit 20 includes a $TiCl_4$ gas supply source 21 for supplying $TiCl_4$ gas as Ti-containing gas, and an $NH_3$ gas supply source 23 for supplying $NH_3$ gas as a nitriding gas. The $TiCl_4$ gas supply source 21 is connected to a $TiCl_4$ gas supply line 22. The $TiCl_4$ gas supply line 22 is connected to a first gas inlet hole 16. The $NH_3$ gas supply source 23 is connected to an $NH_3$ gas supply line 24. The $NH_3$ gas supply line 24 is connected to a second gas inlet hole 17.

An $N_2$ gas supply line 26 is connected to the $TiCl_4$ gas supply line 22. $N_2$ gas is supplied as a carrier gas or a purge gas from the $N_2$ gas supply source 25 to the $N_2$ gas supply line 26.

An oxidizing agent supply line 28 is connected to the $NH_3$ gas supply line 24. An oxygen-containing gas is supplied as an oxidizing agent from the oxidizing agent supply source 27 to the oxidizing agent supply line 28. A plasma of the oxygen-containing gas may be used as the oxidizing agent. At this time, the plasma of the oxygen-containing gas may be supplied as the oxidizing agent from the oxidizing agent supply source 27 or the oxygen-containing gas may be turned into a plasma in the shower head 10. An $N_2$ gas supply line 30 is connected to the $NH_3$ gas supply line 24. $N_2$ gas is supplied as a carrier gas or a purge gas from the $N_2$ gas supply source 29 to the $N_2$ gas supply line 30.

Two valves 34 and a mass flow controller 33 disposed therebetween are installed in each of the $TiCl_4$ gas supply line 22, the NH$_3$ gas supply line 24, the oxidizing agent supply line 28, and the N$_2$ gas supply lines 26 and 30.

Therefore, TiCl$_4$ gas from the TiCl$_4$ gas supply source 21 and N$_2$ gas from the N$_2$ gas supply source 25 reach the gas diffusion space 14 in the shower head 10 from the first gas inlet hole 16 through the TiCl$_4$ gas supply line 22. NH$_3$ gas from the NH$_3$ gas supply source 23, the oxidizing agent from the oxidizing agent supply source 27, and N$_2$ gas from the N$_2$ gas supply source 29 reach the gas diffusion space 14 in the shower head 10 from the second gas inlet hole 17 through the NH$_3$ gas supply line 24. These gases are injected into the chamber 1 through the gas injection holes 15 of the shower plate 12.

The shower head 10 may be of a post-mix type in which TiCl$_4$ gas and NH$_3$ gas are separately supplied into the chamber 1.

A heater 45 for heating the shower head 10 is provided at the base member 11 of the shower head 10. The heater 45 is connected to a heater power supply 46. By supplying power from the heater power supply 46 to the heater 45, the shower head 10 is heated to a desired temperature. An insulating member 47 is provided at a recess formed in an upper portion of the base member 11 to increase a heating efficiency of the heater 45.

A circular opening 35 is formed at a central portion of the bottom wall 1b of the chamber 1. A gas exhaust chamber 36 protruding downward from the bottom wall 1b is provided to cover the opening 35. A gas exhaust line 37 is connected to a side surface of the gas exhaust chamber 36. The gas exhaust line 37 is connected to a gas exhaust unit 38. By operating the gas exhaust unit 38, a pressure in the chamber 1 can be decreased to a predetermined vacuum level.

Three (only two are shown) wafer supporting pins 39 for supporting and vertically moving the wafer W are provided at the susceptor 2 so as to protrude beyond and retract below the surface of the susceptor 2. The wafer supporting pins are supported by a supporting table 40. The wafer supporting pins 39 are vertically moved by a driving unit 41 such as an air cylinder or the like through the supporting table 40.

Formed at a sidewall of the chamber 1 are a loading/unloading port 42 through which the wafer W is loaded/unloaded from/to a wafer transfer chamber (not shown) adjacent to the chamber 1 and a gate valve 43 for opening/closing the loading/unloading port 42.

The film forming apparatus 100 includes a control unit 50. The control unit 50 has a main controller, an input device (keyboard, mouse or the like), an output device (printer or the like), a display device (display or the like), and a storage device (storage medium). The main controller has a CPU (computer) for controlling the respective components of the film forming apparatus 100, e.g., the heater power supplies 6 and 46, the valves 34, the mass flow controllers 33, the driving unit 41 and the like. The storage device stores parameters of various processes performed by the film forming apparatus 100. A storage medium storing a program, i.e., a processing recipe, for controlling processes performed by the film forming apparatus 100 is set in the storage device. The main controller of the control unit 50 controls the film forming apparatus 100 to perform a predetermined operation based on, e.g., the processing recipe stored in the storage medium installed in the storage device or the storage medium set in the storage device.

In the film forming apparatus 100 configured as described above, the gate valve 43 is opened and the wafer W is loaded from a vacuum transfer chamber (not shown) into the chamber 1 through the loading/unloading port 42 by a transfer unit (not shown) and then mounted on the susceptor 2. The susceptor 2 is heated to a predetermined temperature by the heater 5. The wafer W mounted on the susceptor 2 is heated by supplying N$_2$ gas into the chamber 1. When the temperature of the wafer W becomes stable, the formation of the TiON film is started.

In forming the TiON film, first, TiCl$_4$ gas is supplied from the TiCl$_4$ gas supply source 21 into the chamber 1 to be adsorbed onto the surface of the wafer W. Next, the supply of TiCl$_4$ gas is stopped and the chamber 1 is purged by N$_2$ gas. Then, NH$_3$ gas is supplied from the NH$_3$ gas supply source 23 into the chamber 1 and made to react with the adsorbed TiCl$_4$, thereby forming TiN. Thereafter, the supply of NH$_3$ gas is stopped and the chamber 1 is purged by N$_2$ gas. These steps are repeated X times. Then, an oxidation process is performed by supplying an oxidizing agent (e.g., O$_2$ gas) from the oxidizing agent supply source 27 into the chamber 1. Next, the chamber 1 is purged. By repeating Y times a cycle of repeating the above steps X times and performing the oxidation process and the purge process, the TiON film having a desired thickness is formed.

At this time, as described above, the value of X is controlled such that the O content of 50 at % or above can be obtained. The flow rate of the oxidizing agent may be controlled together with the number of X.

After the TiON film is formed as described above, the formation of TiN film is started.

In forming the TiN film, first, TiCl$_4$ gas is supplied from the TiCl$_4$ gas supply source 21 into the chamber 1 to be adsorbed onto the surface of the wafer W. Next, the supply of TiCl$_4$ gas is stopped and the chamber 1 is purged by N$_2$ gas. Then, NH$_3$ gas is supplied from the NH$_3$ gas supply source 23 into the chamber 1 and made to react with the adsorbed TiCl$_4$, thereby forming TiN. Thereafter, the supply of NH$_3$ gas is stopped and the chamber 1 is purged by N$_2$ gas. These steps are repeated a predetermined number of times. Accordingly, the TiN film having a predetermined film thickness is formed.

The TiN-based film in which the TiON film and the TiN film are laminated is formed by repeating the formation of the TiON film and the formation of the TiN film a predetermined number of times.

Upon completion of the film formation, the chamber 1 is purged. The gate valve 43 is opened and the wafer W is unloaded from the chamber 1 through the loading/unloading port 42 by the transfer unit (not shown).

TEST EXAMPLES

Test Example 1

Crystal structures of a TiON film having an O content of 50 at % or above (sample A), a TiON film having an O content of 50 at % or less (sample B) and a TiN film (sample C) were obtained by X-ray diffraction. The films were formed with a thickness of about 10 nm by the above-described method based on ALD.

The X-ray diffraction was performed by out-of-plane measurement and in-plane measurement. The out-of-plane measurement is to measure a lattice surface in parallel with a surface of a sample. The in-plane measurement is to measure a lattice plane perpendicular to the surface of the sample.

In the sample A, the O content of 55 at % was obtained by setting X to 6, the O$_2$ gas flow rate to 1400 sccm and the gas supply period to 15 sec. In the sample B, the O content of 46 at % was obtained by setting the O$_2$ gas flow rate to 300 sccm and the O$_2$ gas supply period to 0.2 sec.

Figure 9A:
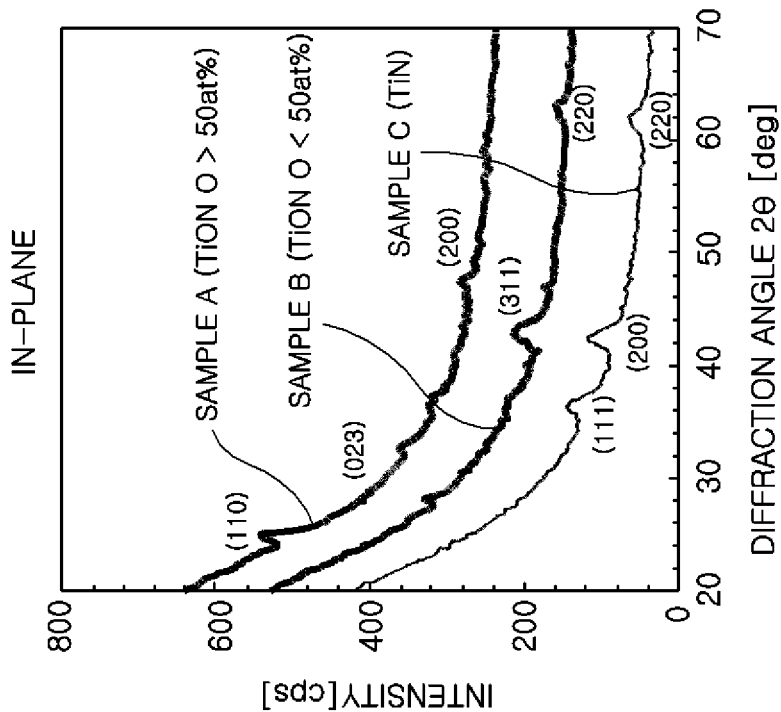
FIGS. 9A and 9B show results of X-ray diffraction (out-of-plane measurement and in-plane measurement) performed on a TiON film having an O content of 50 at % or above (sample A), a TiON film having an O content of less than 50 at % (sample B) and a TiN film (sample C)
Figure 9B:
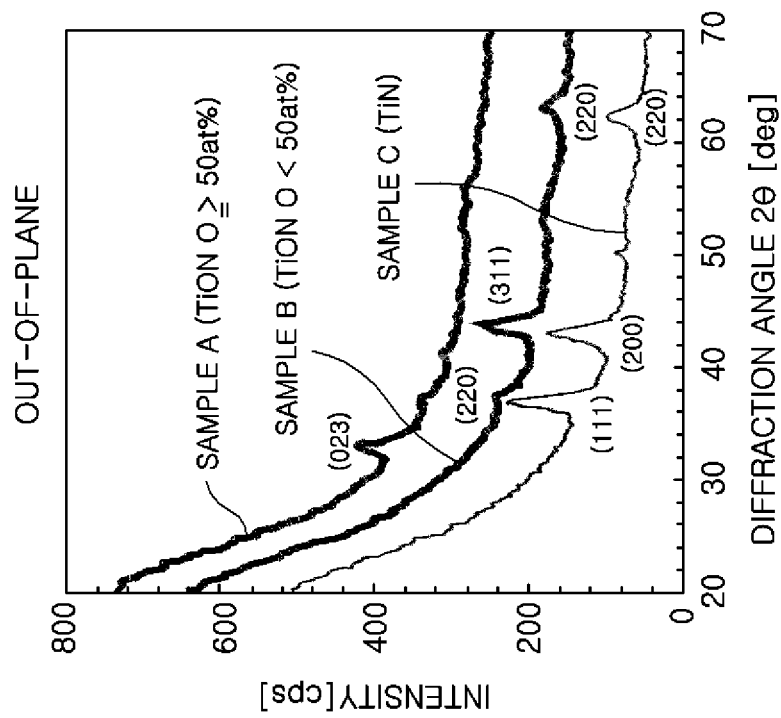

The results are shown in FIGS. 9A and 9B. FIG. 9A shows the result of the out-of-plane measurement. FIG. 9B shows the result of the in-plane measurement. As can be seen from FIGS. 9A and 9B, in the samples B and C, the same diffraction peaks were obtained by the out-of-plane measurement and the in-plane measurement and the crystal structure was cubic. On the other hand, in the sample A, different diffraction peaks were obtained by the out-of-plane measurement and the in-plane measurement and the crystal structure was orthorhombic.

Test Example 2

Crystal sizes (crystal grain diameter) of the single TiON film, the single TiN film, and the laminated film of the TiON film and the TiN film were measured. The crystal sizes were obtained from a full width at half maximum of the diffraction peak in the X-ray diffraction.

The single TiON film had the O content of 55 at % by setting X to 6, an $O_2$ gas flow rate to 1400 sccm and an $O_2$ gas supply period to 15 sec. The thicknesses of the single films were set to about 10 nm. As for the laminated film, laminated films 1 to 4 in which the TiON film and the TiN film were laminated three times were prepared. In the laminated film 1, X in forming the TiON film was set to 6; the $O_2$ gas flow rate was set to 1400 sccm; and the $O_2$ gas supply period was set to 15 sec. In the laminated films 2 to 4, X in forming the TiON film was set to 1; the $O_2$ gas supply period was set to 0.2 sec; and the $O_2$ gas supply flow rate was set to 50 sccm, 100 sccm and 300 sccm, respectively. In the laminated films 1 to 4, the O content in the TiON film was 55 at %.

Figure 10:
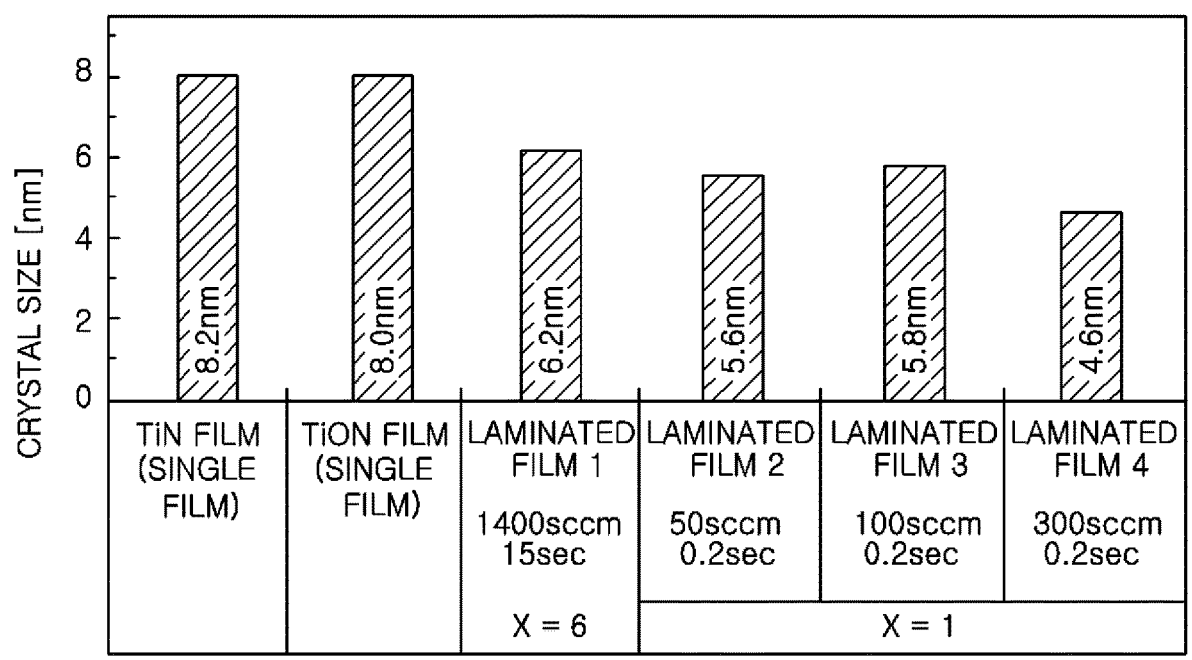
FIG. 10 shows measurement results of crystal sizes (crystal grain diameter) in a single TiON film, a single TiN film, and a laminated film of a TiON film and a TiN film.

The result thereof is shown in FIG. 10. As can be seen from FIG. 10, the crystal sizes (crystal grain diameters) of the single TiN film and the single TiON film was 8.2 nm and 8.0 nm, respectively. The crystal sizes of the laminated films 1 to 4 in which the TiN film and the TiON film are laminated were 6.2 nm, 5.6 nm, 5.8 nm, 4.6 nm, respectively, which are smaller than those of the single films. It has been confirmed that, in the laminated film of the TiN film and the TiON film, the crystal size tends to be reduced as the oxygen content in the TiON film is increased.

From the above, it is clear that the TiN-based film having a small crystal size is formed by laminating the TiON film having the O content of 50 at % or above and the TiN film.

(Other Application)

While the embodiments have been described, the present disclosure is not limited to the above embodiments and may be variously modified within the scope of the present disclosure.

For example, in the above embodiments, the TiON film and the TiN film are formed by the ALD. However, the TiON film and the TiN film may be formed by another thin film forming method.

In the above embodiments, when the film is formed by the ALD method, the film forming apparatus shown in FIG. 8 is used. However, the film forming apparatus is not limited thereto.

In the above embodiments, the semiconductor substrate such as a semiconductor wafer is used as the substrate. However, the substrate is not limited thereto and it is also possible to use another substrate such as a glass substrate for use in flat panel display, a ceramic substrate or the like.

While the disclosure has been shown and described with respect to the embodiments, it will be understood by those skilled in the art that various changes and modifications may be made without departing from the scope of the disclosure as defined in the following claims.

What is claimed is:
1. A TiN-based film comprising:
    a plurality of TiON films having an oxygen content of 50% or above; and
    a plurality of TiN films laminated alternately on the plurality of TiON films such that different crystal structures are placed adjacent to each other.
2. The TiN-based film of claim 1, wherein a total film thickness of the TiN-based film is 3 nm or less.
3. The TiN-based film of claim 1, wherein the TiON film is firstly formed on the substrate.
4. The TiN-based film of claim 1, wherein the TiON film and the TiN film are formed by ALD.
5. A TiN-based film forming method comprising:
    (a) forming a TiON film having an oxygen content of 50 at % or above on a substrate;
    (b) forming a TiN film on the TiON film to position different crystal structures adjacent to each other, and
    (c) repeating (a) and (b) at least once.
6. The TiN-based film forming method of claim 5, wherein the TiON film is formed firstly on the substrate.
7. The TiN-based film forming method of claim 5, wherein the TiON film and the TiN film are formed by ALD.
8. The TiN-based film forming method of claim 7, wherein the TiN film is formed at a predetermined processing temperature by alternately repeating supply of a Ti-containing gas into a processing chamber which accommodates therein the substrate and is maintained in a depressurized state and supply of a nitriding gas into the processing chamber.
9. The TiN-based film forming method of claim 8, wherein the Ti-containing gas is $TiCl_4$ gas and the nitriding gas is $NH_3$ gas.
10. The TiN-based film forming method of claim 7, wherein the TiON film and the TiN film are consecutively formed in a same processing chamber.
11. The TiN-based film forming method of claim 5, wherein the TiON film having a desired film thickness is formed at a predetermined processing temperature by repeating multiple times a cycle of forming a unit TiN film by alternately repeating supply of a Ti-containing gas into a processing chamber which accommodates therein the substrate and is maintained in a depressurized state and supply of a nitriding gas into the processing chamber X times and then oxidizing the unit TiN film by supplying an oxidizing agent into the processing chamber.
12. The TiN-based film forming method of claim 11, wherein the oxidizing agent is an oxygen-containing gas selected from a group consisting of $O_2$ gas, $O_3$ gas, $H_2O$ and $NO_2$ or a plasma of the oxygen-containing gas.
13. The TiN-based film forming method of claim 11, wherein the TiN film is formed at the predetermined processing temperature by alternately repeating supply of a Ti-containing gas into a processing chamber which accommodates therein the substrate and is maintained in a depressurized state and supply of a nitriding gas into the processing chamber.
14. The TiN-based film forming method of claim 13, wherein the Ti-containing gas is $TiCl_4$ gas and the nitriding gas is $NH_3$ gas.
15. The TiN-based film forming method of claim 11, wherein the Ti-containing gas is $TiCl_4$ gas and the nitriding gas is $NH_3$ gas.

16. The TiN-based film forming method of claim 5, wherein the TiON film and the TiN film are laminated three times or more.

17. The TiN-based film forming method of claim 5, wherein a total film thickness of the TiN-based film is 3 nm or less.

18. A non-transitory computer-executable storage medium storing a program for controlling a film forming apparatus, wherein the program, when executed on a computer, controls the film forming apparatus to perform the method described in claim 5.

* * * * *